(12) United States Patent
Koehnke et al.

(10) Patent No.: US 7,898,365 B2
(45) Date of Patent: Mar. 1, 2011

(54) INTEGRATED SAW DEVICE HEATER

(75) Inventors: Mark A. Koehnke, Attleboro, MA (US); Stephen J. Pereira, Hopedale, MA (US)

(73) Assignee: Raytheon Company, Waltham, MA (US)

( * ) Notice: Subject to any disclaimer, the term of this patent is extended or adjusted under 35 U.S.C. 154(b) by 552 days.

(21) Appl. No.: 11/516,873

(22) Filed: Sep. 6, 2006

(65) Prior Publication Data

US 2008/0055022 A1 Mar. 6, 2008

(51) Int. Cl.
H03H 9/64 (2006.01)

(52) U.S. Cl. .................................. 333/193; 333/196

(58) Field of Classification Search ......... 333/193–196; 331/107 AS; 310/313 R, 313 B, 313 C, 313 D
See application file for complete search history.

(56) References Cited

U.S. PATENT DOCUMENTS

| 4,270,105 A | | 5/1981 | Parker et al. | |
|---|---|---|---|---|
| 4,766,411 A | * | 8/1988 | Prieto et al. | 338/306 |
| 5,048,336 A | * | 9/1991 | Sugihara et al. | 73/29.01 |
| 5,235,236 A | * | 8/1993 | Nakahata et al. | 310/313 R |
| 5,576,589 A | * | 11/1996 | Dreifus et al. | 310/313 A |
| 5,896,259 A | | 4/1999 | Farwell et al. | |
| 5,992,215 A | * | 11/1999 | Caron et al. | 73/24.01 |
| 6,018,211 A | * | 1/2000 | Kanaboshi et al. | 310/313 R |
| 6,060,692 A | * | 5/2000 | Bartley et al. | 219/210 |
| 6,351,194 B2 | * | 2/2002 | Takahashi et al. | 333/133 |
| 7,134,319 B2 | | 11/2006 | Liu | |
| 7,399,280 B2 | * | 7/2008 | Liu et al. | 600/504 |

OTHER PUBLICATIONS

Tigli, O, Design and fabrication of a novel SAW bio/chemical sensor in CMOS, Oct. 30-Nov. 3, 2005, Sensors, 2005 IEEE. pp. 137-140.*
Tigli, O. Design and fabrication of a novel SAW biw/chemical sensor in CMOS, Oct. 30-Nov. 3, 2005, Sensors, 2005 IEEE. pp. 137-140.*
Tigli, O. Design and fabricatio of a novel SAW bio/chemical sensor in CMOS. Oct. 30-Nov. 3, 2005, Sensors IEEE. pp. 137-140.*
Tigli et al., "Design and Fabrication of a novel SAW Bio/Chemical Sensor in CMOS", IEEE, 2005, pp. 137-140.
Written Opinion for PCT/2007/019330, International Searching Authority, dated Aug. 25, 2008, 7 pages (unnumbered).

* cited by examiner

*Primary Examiner*—Rexford N Barnie
*Assistant Examiner*—Crystal L Hammond
(74) *Attorney, Agent, or Firm*—Iandiorio Teska & Coleman

(57) ABSTRACT

An integrated SAW device features an electronic assembly, a SAW device mounted to the electronic assembly, and a heater element on the SAW device to minimize thermal resistance between the SAW device and the heater element.

16 Claims, 8 Drawing Sheets

INTEGRATED SAW DEVICE HEATER

FIELD OF THE INVENTION

The subject invention relates to surface acoustic wave (SAW) devices.

BACKGROUND OF THE INVENTION

A typical surface acoustic wave (SAW) device functions as a filter or a resonator for a specific range of radio frequency (RF) inputs. When implemented in the appropriate feedback circuit configuration, the SAW resonator along with associated electronic circuitry functions as an oscillator. When used as a serial component, the SAW resonator functions as a simple filter. Such electronic circuitry is usually embodied on a circuit board and housed within an enclosure.

For high performance applications, the SAW device must be thermally stable to ensure stable RF performance. Typically, a heater element is physically coupled externally to the enclosure containing the SAW circuitry. In this way, the whole device package, supporting electronics and the SAW device within the package is heated and hence thermally stabilized. Alternatively, in some designs, one or more heater elements are physically coupled to a stiffener block attached to the back side of the circuit board to which one or more SAW devices are mounted in an attempt to apply heat more directly to the SAW device.

The result in the prior art is a large thermal resistance between the SAW device and the heater resulting in excessive losses with commensurate increased time and/or heater power necessary to achieve required thermal stability. Moreover, it may, in some instances, be undesirable to unnecessarily heat secondary electronic components associated with the SAW device as this incurs unnecessary reliability degradation. Also, due to the additional components associated with the heater and the cost of hybrid heater devices themselves, the cost of the final product in the prior art increases as does the difficulty of assembly.

SUMMARY OF THE INVENTION

It is therefore an object of this invention to provide a SAW device with a more integrated heat source.

It is a further object of this invention to provide such a device in which the thermal resistance between the heat source and the SAW device is minimized.

It is a further object of this invention to provide such a device that reduces heat losses.

It is a further object of this invention to provide such a device that requires less heater power.

It is a further object of this invention to provide such a device which achieves thermal stability faster.

It is a further object of this invention to provide such a device which is more reliable.

It is a further object of this invention to provide such a device which is less costly.

It is a further object of this invention to provide such a device which is easier to assemble.

The subject invention results from the realization that lower thermal resistance between the SAW device and its heater or heaters can be minimized resulting in lower heat losses, lower power requirements, faster thermal stability, increased reliability, lower costs, and increased ease of assembly by deposition of a heater element directly on the SAW device instead of mounting a heater on the electronic package housing the SAW device.

The subject invention, however, in other embodiments, need not achieve all these objectives and the claims hereof should not be limited to structures or methods capable of achieving these objectives.

This invention features a SAW device with an integrated heater. The SAW device is mounted to an electronic assembly and a heater element is disposed on the SAW device to minimize thermal resistance between the SAW device and the heater element. Typically, the electronic assembly includes a circuit board and often the circuit board is housed in a package. The SAW device may be configured as a resonator, a filter, or as an oscillator.

One typical SAW device includes an active substrate and the heater element may be disposed on the back side of the active substrate. Or, the heater element may be disposed on the back side of the lid of the SAW device.

The typical heater element includes a resistive film sputtered onto the SAW device. The resistive film can include chrome or tantalum-nitride. A typical heater element further includes bond pads on the resistive film. In one example, the bond pads include a nickel layer overlaying the resistive film and the SAW device and a gold layer on the nickel layer.

A typical resistive film is less than 600 Å thick, has an area of less than 1 square inch, and is centrally disposed on the SAW device.

One integrated SAW device heater in accordance with the subject invention features a SAW device and a resistive film deposited onto the SAW device configured as a heater element.

Also, an integrated SAW device heater in accordance with this invention features a SAW device, a heater element, and minimal thermal resistance between the SAW device and the heater element. In one example, there is minimal thermal resistance between the SAW device and the heater element.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
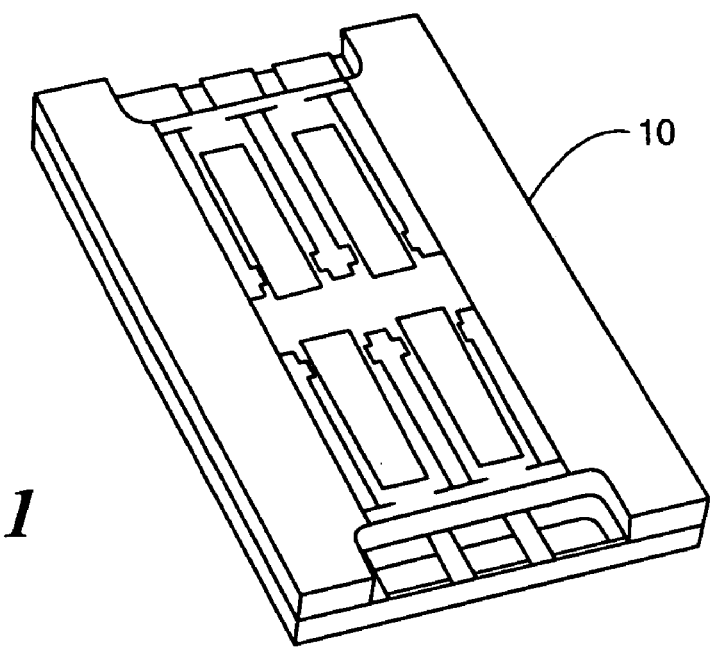
FIG. 1 is a schematic three-dimensional view showing one example of a SAW device in accordance with the invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
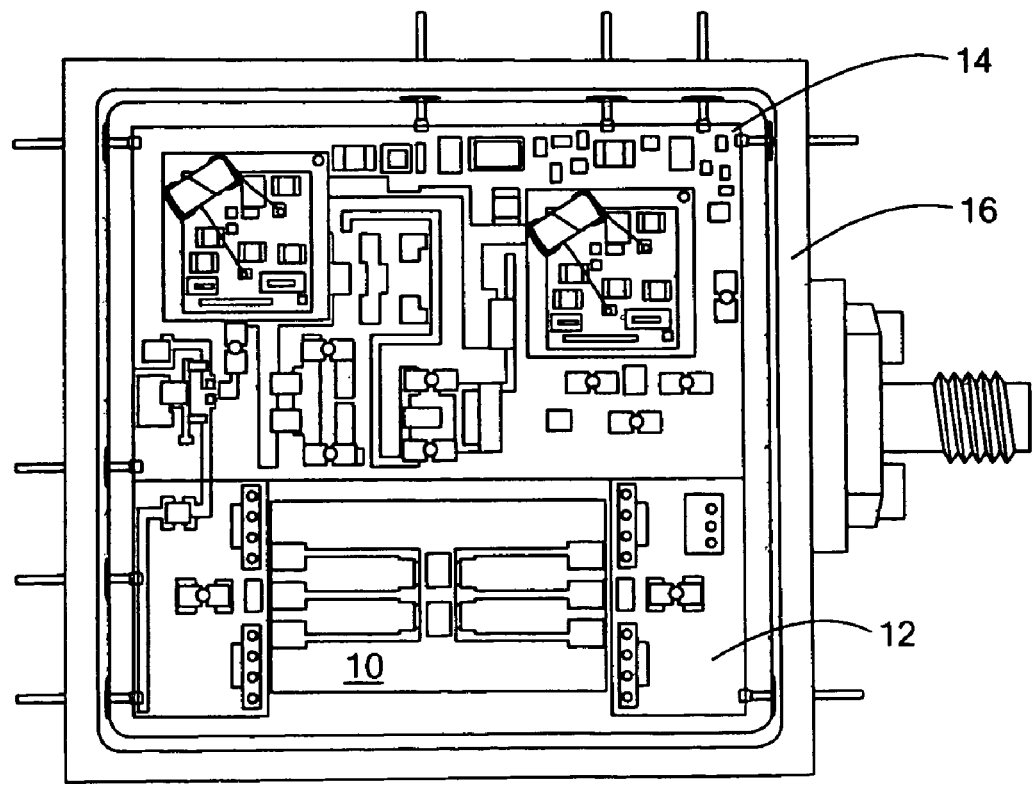
FIG. 2 is a schematic three-dimensional view showing the SAW device of FIG. 1 mounted to a circuit board and housed within a package.

FIG. 1 shows one version of a SAW device 10 in accordance with U.S. Pat. No. 4,270,105 incorporated herein by this reference. FIG. 2 shows SAW device 10 mounted on circuit board 12 of electronic assembly 14 itself housed in oscillator package 16.

Figure 3:
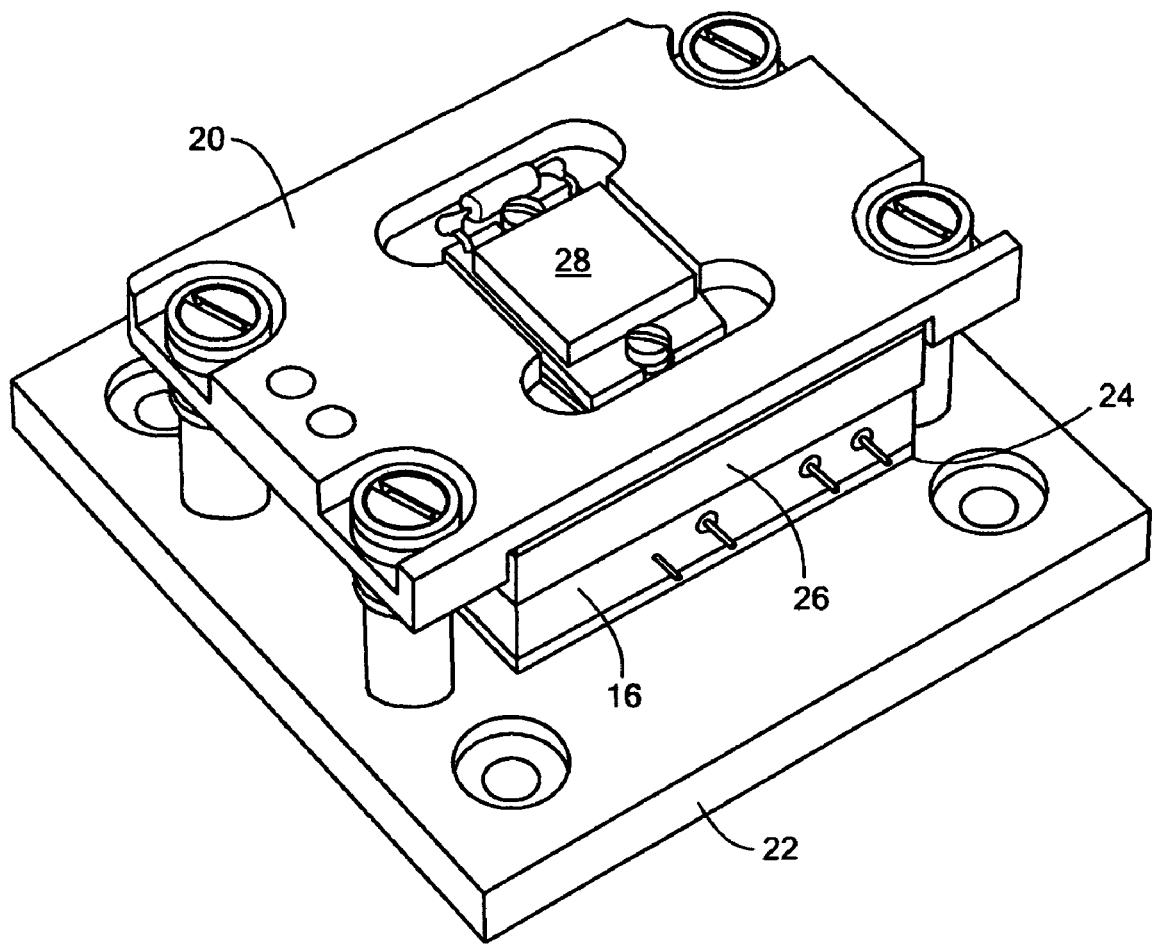
FIG. 3 is a schematic three-dimensional view showing the package of FIG. 2 and the components required for a thermal stability heating subsystem in accordance with the prior art.
Figure 4:
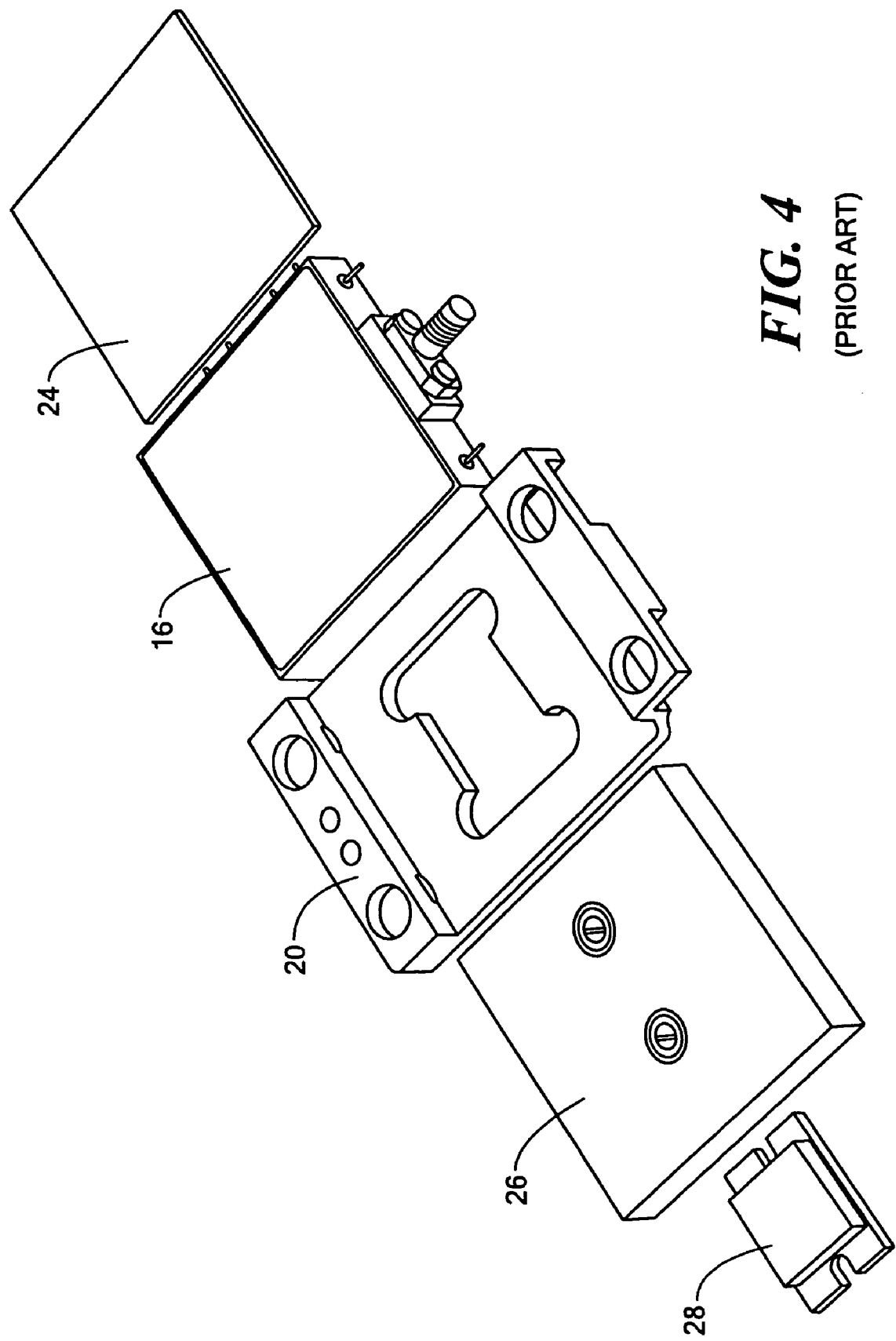
FIG. 4 is a schematic three-dimensional view showing the various components of FIG. 3 separately.

As described in the Background section above, SAW device 10 must be heated to achieve thermal stability. In the prior art, oscillator package 16, FIG. 3 was clamped between frame members 20 and 22 after lid stiffener plate 24 and alumina block 26 were placed on oscillator package 16. Hybrid heater 28 is received in frame member 20. FIG. 4 also shows the components of FIG. 3 separately. Hybrid heater 28 consumes 28 watts (28 V@1 A) of power to stabilize the SAW device in oscillator package 16 to a temperature of 65° C. in 8 minutes assuming an initial ambient temperature of −40° C. One reason for this high power consumption is the large thermal resistance between heater 28, FIG. 3 and the SAW device within oscillator package 16. The thermal resistance is due to alumina block 26, the top of oscillator package 16, and the long thermal path between the top of oscillator package 16 and SAW device 10, FIG. 1.

Figure 5A:
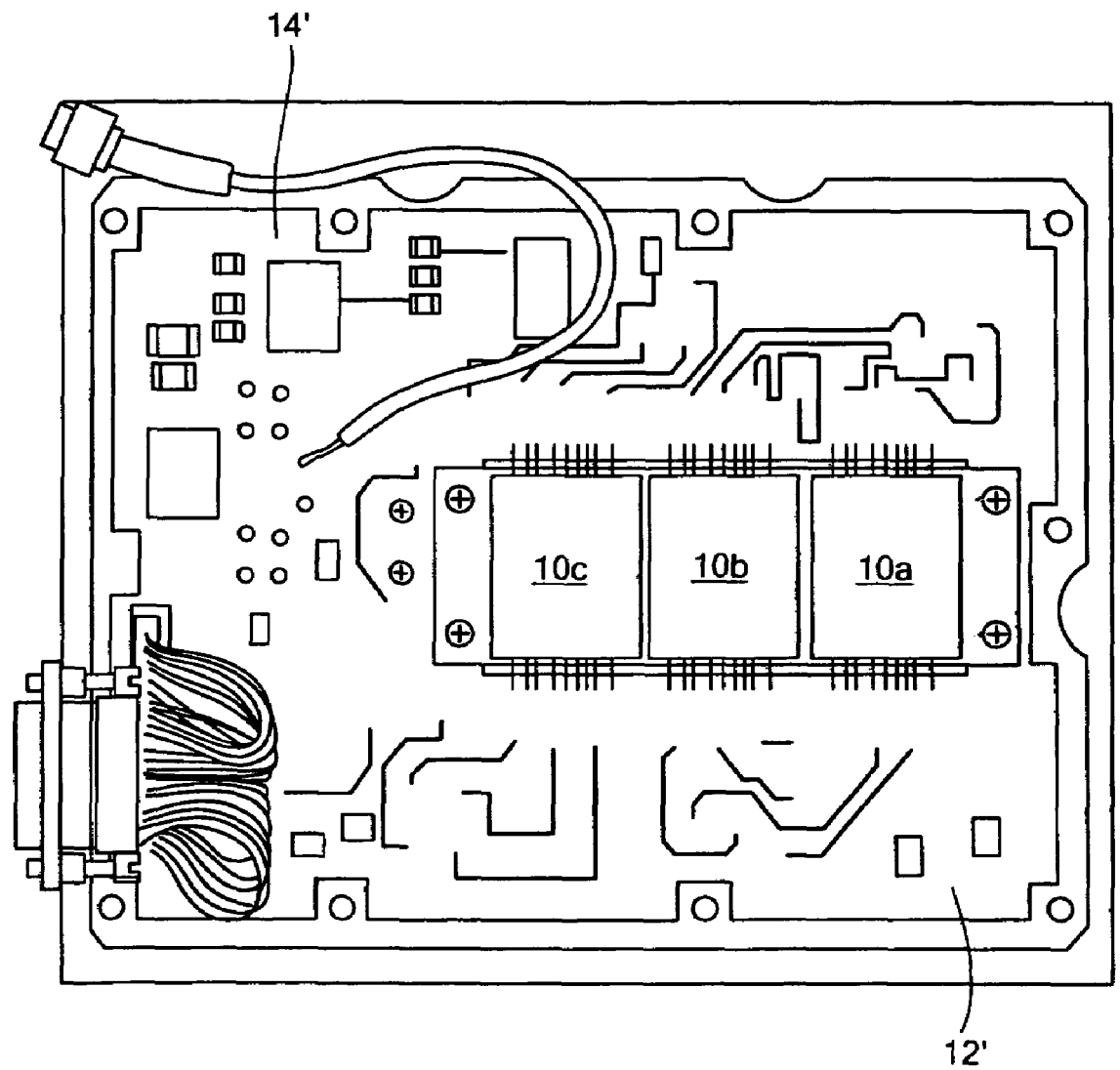
FIG. 5A is a top view showing another prior art arrangement where three SAW devices are mounted to a circuit board.
Figure 5B:
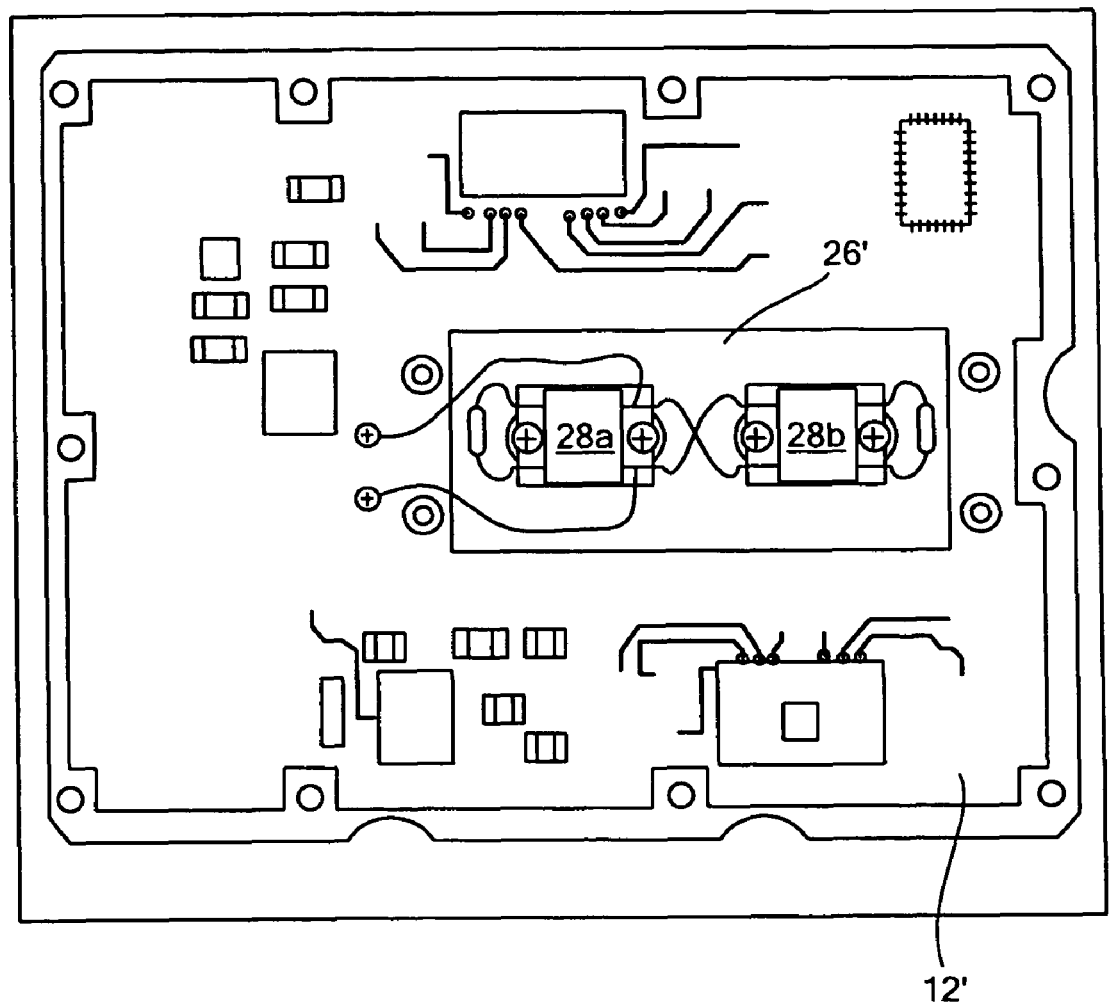
FIG. 5B is a view of the back side of the circuit board shown in FIG. 5A showing two heaters mounted to the back side of a circuit board via a stiffener block.

In another example of prior art, FIG. 5A shows three packages 10a, 10b, and 10c mounted to circuit board 12' of electronic assembly 14' for a system where the SAW devices within the packages are used as resonators. Two 10-watt heaters 28a and 28b, FIG. 5b are mounted on alumina stiffener block 26' itself mounted to the back side of circuit board 12'. Again, the thermal resistance is high due to the presence of alumina block 26' and circuit board 12' between heaters 28a, 28b and packages 10 and 10c. In this less stressing application, the SAW is required to stabilize at 65° C. in less than 20 minutes from an ambient temperature of 0° C.

In addition, in both of these prior art designs, it may be undesirable to apply heat to the electronic components associated with the SAW device. Also, due to the additional components associated with the heater, the cost of the final product increases as does the difficulty of assembly.

Figure 6B:
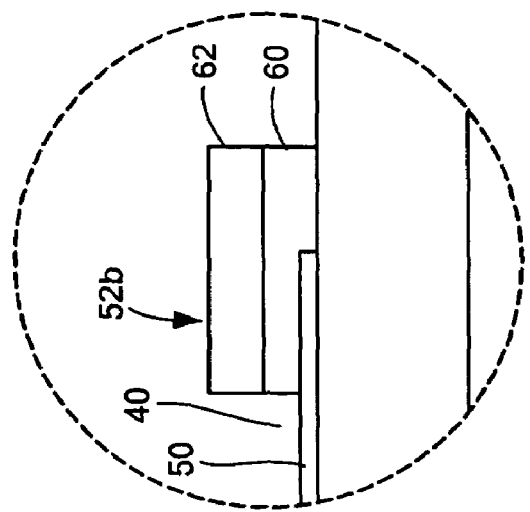
FIG. 6B is a partial side view showing in more detail a portion of the heater element shown in FIG. 6B in accordance with subject invention.
Figure 6A:
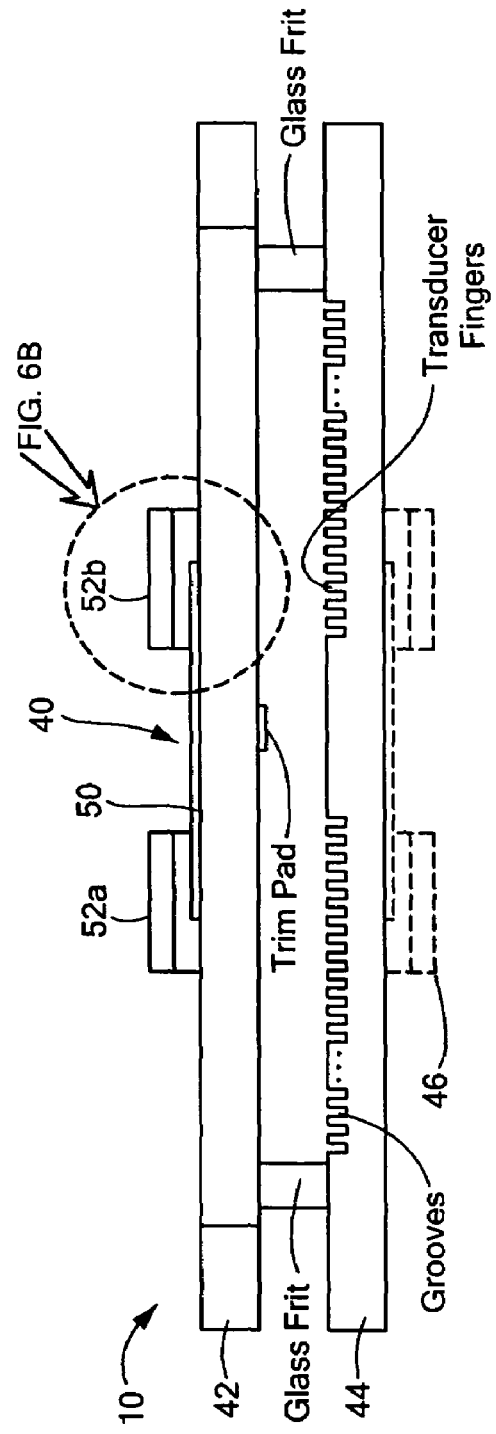
FIG. 6A is a side view showing an embodiment of a SAW device with an integrated heater in accordance with the subject invention.
Figure 7:
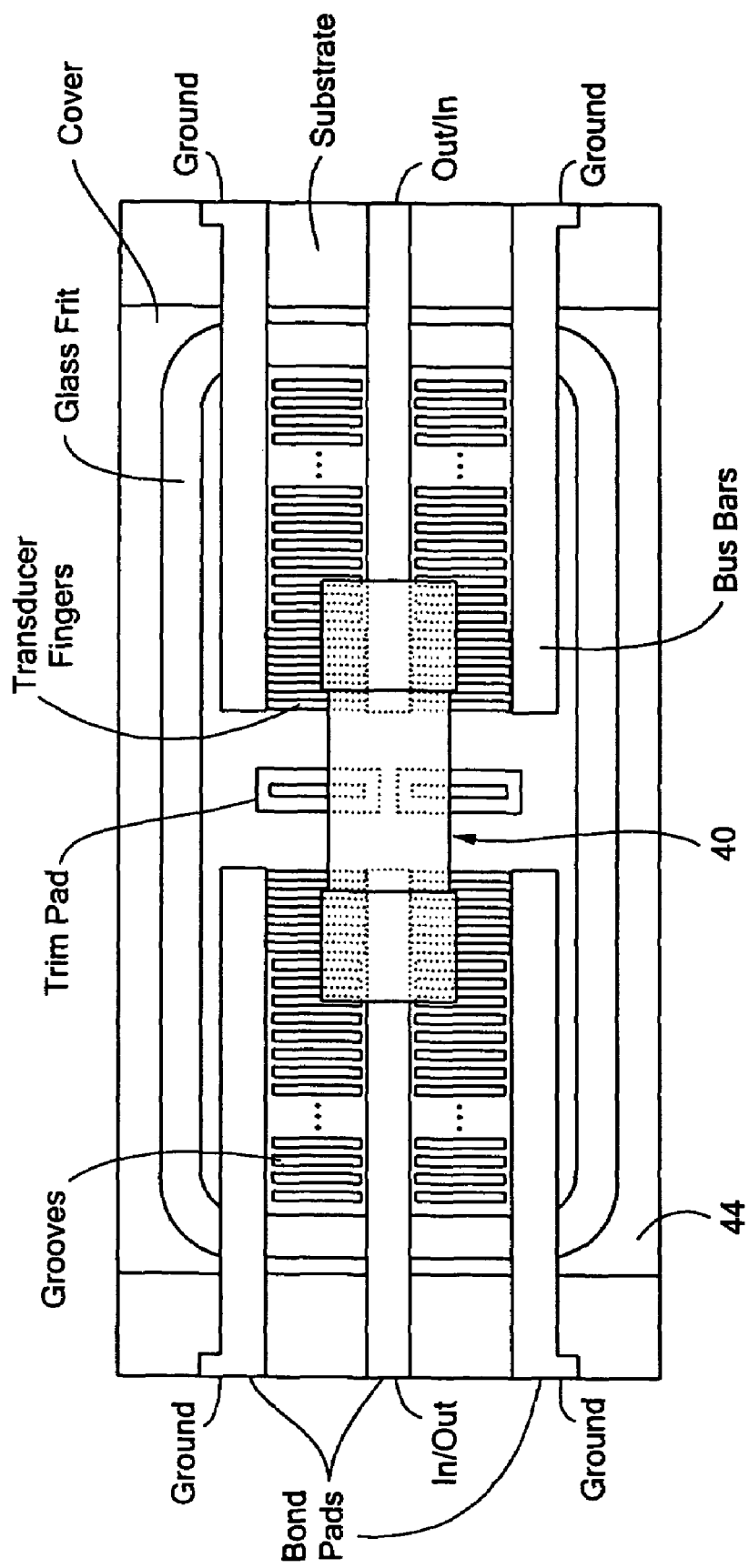
FIG. 7 is a top view of the integrated device shown in FIG. 6A.

In accordance with this subject invention, in contrast, heater element 40 FIGS. 6A, 6B, and 7 is disposed directly on SAW device 10 to minimize the thermal resistance between SAW device 10 and heater element 40. Moreover, the electronic components associated with the SAW device are not heated unnecessarily, the number of components required to achieve thermal stability are reduced, the cost is reduced, and assembly is easier and faster. When mounted in the appropriate configuration, SAW device 10 can also function as a filter in addition to the resonator as shown in FIG. 2.

Heater element 40 can be disposed centrally, uniformly, non-uniformly or peripherally on the top side of the SAW device quartz lid or cover 42 as shown or centrally, uniformly or peripherally on the back side of active quartz substrate 44 as shown in phantom at 46 or disposed on both cover and substrate as necessary. Heater element 40 preferably includes resistive film 50, FIG. 6B typically, but not limited to, chrome or tantalum-nitride sputtered onto the SAW device.

Figure 8:
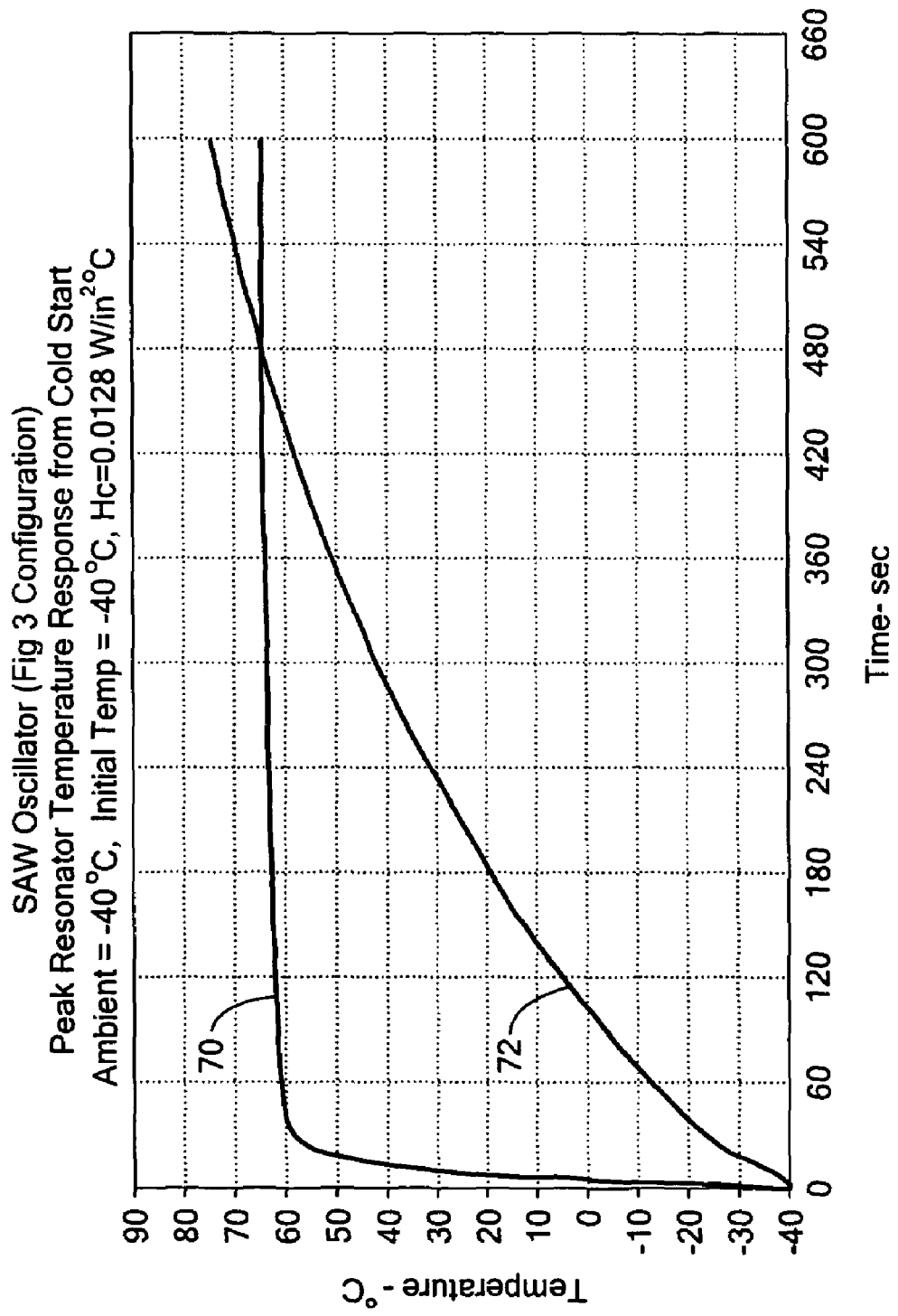
FIG. 8 is a graph showing the time to achieve thermal stability as one example of the benefits of direct SAW substrate heating in accordance with the subject invention.

FIG. 8 provides one example where the performance of a 2.25 W heater element in accordance with this invention as shown at 70 is compared to the prior art as shown at 72. Such an embodiment consumes ten times less power and provides thermal stability ten times faster than the design of the prior art.

For the example shown in FIG. 8, the 2.25 watt resistive film 50 was a 0.15 inches square, 170 Å thick layer of chrome with a power handling capacity of 25 watts per square inch and a sheet resistivity of 50 ohms per square. Typically, the heater element 40 also includes bond pads 52a and 52b, FIG. 6A on resistive film 50. One preferred bond pad includes a nickel layer 60 200 Å thick, and 20,000 Å thick gold layer 62 on nickel layer 60.

Alternatively, the 2.25 watt resistive film 50 can be realized as 0.15 inches square, 500 Å thick layer of Tantalum-Nitride (TaN) with a power handling capacity of 60 watts per square inch and a sheet resistivity of 50 ohms per square. For TaN, the bond pad includes a 20,000 Å thick gold layer 60 on resistive film 50. The secondary metallization layer 62 is not required for this embodiment.

The implementation of the heater element can be in any aspect ratio from a square to a meandering line as long as the surface area is consistent with the power required and the power density of the resistive film 50 material.

A temperature sensor for the resonator can be attached to provide the proportional control power to the integrated heater element. There are many low cost commercial sensors that can perform a temperature sensing function and are also available in physically compatible SOT-23 package or bare die form that could be attached directly to the SAW substrate and connected via wire bonds to the SAW Resonator package or hybrid substrates. Off-resonator circuitry can monitor the thermal sensor and provide current to the integrated heater element. Alternatively, a variation of the present hybrid design can be implemented to exploit thermal sensing and provide current to the integrated heater element. Alternatively, in applications with less stringent temperature/frequency tolerance requirements, a thermistor can be attached to the SAW resonator to control power or the resistive film 50 itself could be implemented as a film thermistor.

The subject invention mitigates numerous issues associated with the current state of the art. There is a dramatically improved "quick start" capability since heat is focused on the low mass, frequency dominant SAW resonator. Depending upon application, the subject invention offers a 10 to 100 times reduction in start up time. There is a ten times magnitude reduction in power consumption. There is a decreased ambient (air) heat in surrounding spaces. There is a potential reliability improvement to oscillator and end item assembly by heating only the (passive) SAW resonator. There is also a system cost reduction eliminating hybrid heaters which currently can cost $300-400 each. The invention enables SAW oscillators to become viable solutions in applications where current heater power and response time preclude their use. This includes missiles, UAVs, airborne radar, space and satellite applications.

Table 1 summarizes several program level heater requirements compared to what is possible with the Integrated SAW Resonator Heater of this invention. Prior art power consumption is derived from prior art power times number of SAW devices required for the program application.

TABLE 1

| Program (Configuration) | Prior Art Power Consumption | Potential Power Consumption | Power Reduction | Prior Art Time to Stabilize | Potential Time to Stabilize | Stabilization Time Reduction |
| --- | --- | --- | --- | --- | --- | --- |
| A (FIG. 3) | 392 W | 31.5 W | 92% | 480 sec | 40 sec | 92% |
| B (FIG. 5A/5B) | 66 W | 12 W | 82% | 1200 sec | 60 sec | 95% |

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims. This includes SAW devices and packaging other than the designs shown in the figures. Filters, delay lines, and sensors are also possible.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. An integrated SAW device heater comprising:
    a SAW device including a lid; and
    a heater element resistive film deposited onto a back side of the lid of the SAW device and configured as a heater element.

2. The device of claim 1 further including a circuit board for mounting the SAW device and a package for housing the circuit board.

3. The device of claim 1 in which the resistive film is sputtered onto the SAW device.

4. The device of claim 1 in which the resistive film includes chrome.

5. The device of claim 1 in which the resistive film includes tantalum-nitride.

6. The device of claim 1 in which the heater element further includes bond pads on the resistive film.

7. The device of claim 6 in which the bond pads include one or more layers overlaying the resistive film and the SAW device.

8. The device of claim 1 in which the resistive film is less than 600 Å thick.

9. The device of claim 1 in which the resistive film has an area of less than 1 square inch.

10. The device of claim 1 in which the heater element is centrally, uniformly, non-uniformly or peripherally disposed on the SAW device.

11. An integrated SAW device comprising:
    an electronic assembly;
    a SAW device mounted to the electronic assembly, the SAW device including an a lid; and
    a heater element disposed on the top side of the lid of the SAW device to minimize thermal resistance between the SAW device and the heater element.

12. The device of claim 11 in which the electronic assembly includes a circuit board.

13. The device of claim 12 in which the circuit board is housed in a package.

14. The device of claim 11 in which the SAW device is configured as a resonator.

15. The device of claim 11 in which the SAW device is configured as a filter.

16. The device of claim 11 in which the SAW device is configured as an oscillator.

\* \* \* \* \*